(12) United States Patent
Cheah et al.

(10) Patent No.: US 6,388,319 B1
(45) Date of Patent: May 14, 2002

(54) THREE COMMONLY HOUSED DIVERSE SEMICONDUCTOR DICE

(75) Inventors: Chuan Cheah, Redondo Beach; Naresh Thapar, Los Angeles; Srini Thiruvenkatachari, Redondo Beach, all of CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/577,867

(22) Filed: May 24, 2000

Related U.S. Application Data

(60) Provisional application No. 60/135,712, filed on May 25, 1999.

(51) Int. Cl.⁷ ............................................... H01L 23/34
(52) U.S. Cl. ...................... 257/723; 257/724; 257/497; 257/773
(58) Field of Search ................................. 257/109, 497, 257/685, 723, 773, 901, 904, 724

(56) References Cited

U.S. PATENT DOCUMENTS

| | | | | |
|---|---|---|---|---|
| 5,663,597 A | * | 9/1997 | Nelson et al. | 257/676 |
| 5,677,245 A | * | 10/1997 | Brown et al. | 438/25 |
| 5,814,884 A | * | 9/1998 | Davis et al. | 257/497 |
| 5,886,563 A | * | 3/1999 | Nasila | 327/423 |
| 6,133,632 A | * | 10/2000 | Davis et al. | 257/723 |
| 6,144,093 A | * | 11/2000 | Davis et al. | 257/723 |
| 6,297,552 B1 | * | 10/2001 | Davis et al. | 257/497 |

* cited by examiner

Primary Examiner—Kevin M. Picardat
(74) Attorney, Agent, or Firm—Ostrolenk, Faber, Gerb & Soffen, LLP

(57) ABSTRACT

A semiconductor device includes: at least first, second, and third semiconductor dice, each having opposing surfaces which contain respective electrodes; a conductive lead frame including first and second separate die pad areas, the first and second semiconductor dice being disposed on the first die pad, and the third semiconductor die being disposed on the second die pad; a first plurality of pins being integral with and extending from one edge of the first die pad; a second plurality of pins being integral with and extending from one edge of the second die pad; a third plurality of pins being separated from one another and from the first and second die pads; a first plurality of bonding wires connecting one surface of the first semiconductor die to at least one of the third plurality of pins; a second plurality of bonding wires connecting one surface of the third semiconductor die to at least another one of the third plurality of pins; and a housing for encapsulating the lead frame, semiconductor dice, and bonding wires, the first, second and third pluralities of pins extending beyond a periphery of the housing for external connection.

17 Claims, 3 Drawing Sheets

US 6,388,319 B1

THREE COMMONLY HOUSED DIVERSE SEMICONDUCTOR DICE

CROSS REFERENCE TO RELATED APPLICATION

This application is based on and claims priority to U.S. Provisional Patent Application No. 60/135,712, filed May 25, 1999, the entire disclosure of which is hereby incorporated by reference.

FIELD OF THE INVENTION

This invention relates to semiconductor devices, and more specifically relates to a novel device in which a plurality of dice, which may be of diverse size and of diverse junction pattern, are fixed to a common die pad and another die is fixed to another die pad, all being disposed within a common package or housing.

BACKGROUND OF THE INVENTION

Numerous electrical circuits, for example, DC to DC converters, synchronous converters, and the like require a number of semiconductor components such as MOSFETs and Schottky diodes. These circuits components are frequently used in portable electronics apparatus and their components are commonly separately housed and must be individually mounted on a support board. The separately housed parts take up board space. Further, each part generates heat and, if near other components, such as microprocessors, can interfere with the operation of the microprocessor.

Referring to FIG. 1, there is shown a conventional buck converter circuit, sometimes known as a step down converter, which is commonly used to reduce the voltage delivered to integrated circuits and processors on a circuit board of a portable electronic device or the like. For example, the circuit might be used to reduce an input voltage of 12 volts DC to 5 volts DC (or 3.3 or 1.5 volts DC in some cases) to drive an integrated circuit or other load (not shown).

The circuit of FIG. 1 is well known and uses an N-channel MOSFET 10 for the switching function under the control of a suitable control circuit 11 connected to the MOSFET gate G. A Schottky diode 12 has its cathode connected to the drain D of MOSFET 10 and is used to permit output current recirculation into inductor 13 and capacitor 14 when the MOSFET 10 is off.

U.S. Pat. No. 5,814,884 discloses a package in which a MOSFET and Schottky diode are mounted on a common die pad in order to reduce board space, parts count, and costs.

It would be desirable to reduce the board space required by plural semiconductor devices and to reduce part count and assembly costs in such power converters and other power subsystems for high-density applications.

BRIEF DESCRIPTION OF THE INVENTION

In accordance with the invention a semiconductor device includes: at least first, second, and third semiconductor dice, each having opposing surfaces which contain respective electrodes; a conductive lead frame including first and second separate die pad areas, the first and second semiconductor dice being disposed on the first die pad, and the third semiconductor die being disposed on the second die pad; a first plurality of pins being integral with and extending from one edge of the first die pad; a second plurality of pins being integral with and extending from one edge of the second die pad; a third plurality of pins being separated from one another and from the first and second dice pads; a first plurality of bonding wires connecting one surface of the first semiconductor die to at least one of the third plurality of pins; a second plurality of bonding wires connecting one surface of the third semiconductor die to at least another one of the third plurality of pins; and a housing for encapsulating the lead frame, semiconductor dice, and bonding wires, the first, second and third pluralities of pins extending beyond a periphery of the housing for external connection.

The housing and first, second, and third pluralities of pins may conform to an SO-8 package standard. The first and second pluralities of pins may be disposed along a common edge of the housing. Preferably, the third plurality of pins is disposed along an opposite common edge of the housing.

According to another aspect of the invention, the first and second dice are MOSFET dice, each having a source, drain and gate electrode; the surfaces of the first and second MOSFET dice in contact with the respective first and second die pad areas are the drain electrodes; and the respective source and gate electrodes of the first and second MOSFET dice are connected to respective ones of the third plurality of pins.

Preferably, the second semiconductor die is a Schottky diode die, the opposite surface of the second semiconductor die including a cathode electrode of the Schottky diode which is coupled to the first die pad area such that the cathode electrode of the Schottky diode is electrically connected to the drain electrode of the first MOSFET die and to the first plurality of pins, the opposite surface of the Schottky diode die comprising an anode electrode. Preferably, the anode electrode of the Schottky diode die is coupled via bonding wires to the source electrode of the first MOSFET die.

Other features and advantages of the present invention will become apparent from the following description of the invention which refers to the accompanying drawings.

DETAILED DESCRIPTION OF THE INVENTION

Figure 1:
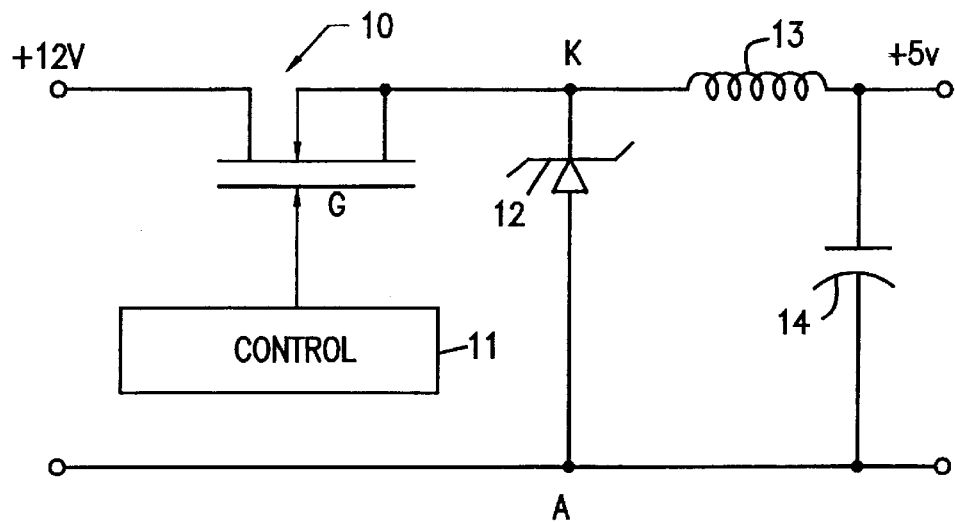
FIG. 1 is a circuit diagram of a known buck converter circuit.
Figure 2:
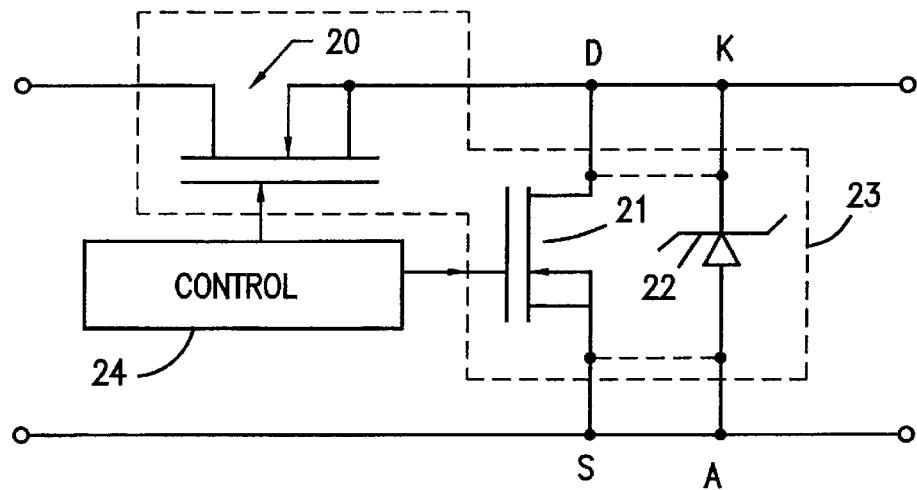
FIG. 2 is a circuit diagram of the invention employing a series MOSFET and a parallel MOSFET and Schottky diode.

FIG. 2 shows a synchronous buck converter circuit using an N channel MOSFET 20 as the switching device, an and, in place of diode 12 of FIG. 1, N channel MOSFET 21, and a Schottky diode 22 in parallel for synchronous rectification. The circuit of FIG. 2 may also be employed in a forward synchronous rectification circuit.

In accordance with the invention, MOSFET 20, MOSFET 21 and Schottky diode 22 may be dice which are co-packaged within a common housing, as shown by dotted block 23 in FIG. 2. This circuit is useful to avoid losses forward voltage drop of the due to the diode 12 of FIG. 1. It also eliminates the effects of the inherent body diode (not shown) of the vertical conduction MOSFET 21 since the Schottky diode 22 handles the reverse current flow seen by the synchronous rectifier during the "wait" state of controller 24.

MOSFETs 20,21 of FIG. 2 maybe 30 v, 35 m-ohm dice available from the International Rectifier Corporation.

Figure 3:
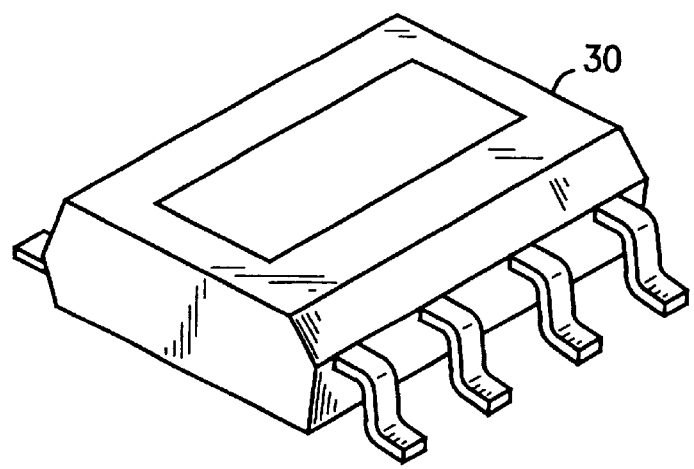
FIG. 3 is a perspective view of an SO-8 style package which can be used to house both MOSFET dice and the Schottky die of FIG. 2 in accordance with an embodiment of the invention.
Figure 4:
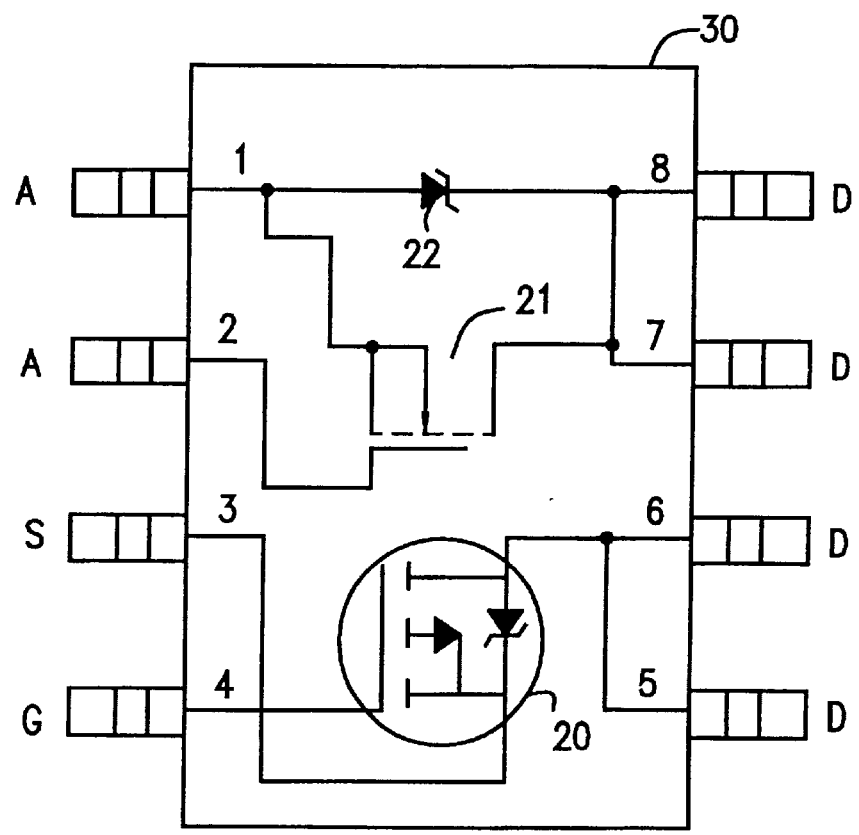
FIG. 4 is a schematic top view of the package of FIG. 3 and the circuit of FIG. 2.

Housing 23 may take the form of a known Type SO-8, shown in FIGS. 3 and 4. Thus, FIG. 3 shows an SO-8 surface mount housing with eight in-line pins 1 to 8 (FIG. 4) which extend from a plastic insulation housing 30. As seen in FIG. 4, the MOSFET die 20, MOSFET die 21, and Schottky diode 22 are mounted in a common package 30 (as will be later described) and are interconnected to enable their external connection as in FIG. 2 or in other circuit configurations. Preferably, however, as many internal connections as possible are made to reduce circuit inductance.

Figure 5:
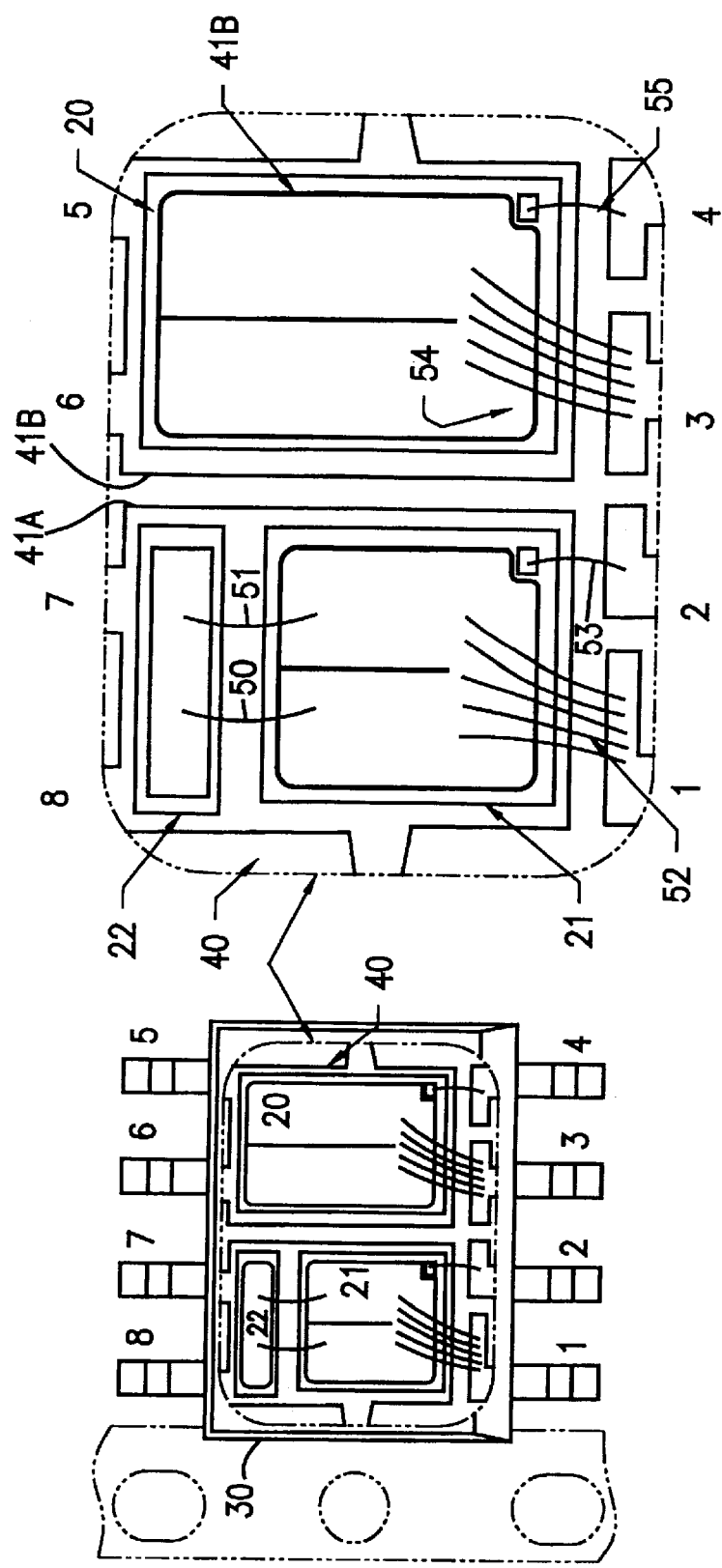
FIG. 5 shows a top view of the lead frame of the package of FIGS. 3 and 4 with an enlarged inset and shows the mounting of the MOSFET dice and the Schottky diode die fastened to space lead frame pads.

In FIG. 4, the drain of MOSFET 21 and cathode of Schottky diode 22 are connected to one another and to pins 7 to 8 of a common lead frame section as will be later described. The source and gate of MOSFET 21 are connected by wire bonds to isolated pins 1 and 2, respectively, and the anode of Schottky diode 22 is connected by wire bonds to the source of MOSFET 21. FIG. 5 shows a lead frame 40, MOSFET 20, MOSFET 21, and Schottky diode 22 in more detail. The lead frame 40 includes a first die pad 41A from which pins 7 and 8 integrally extend. The first die pad 41A may be larger than the main pad body of a conventional lead frame so that both MOSFET 21 and the Schottky diode 12 may be mounted to it. The lead frame 40 also includes a second die pad 41B for receiving MOSFET 20 and from which pins 5 and 6 integrally extend. According to a novel aspect of the invention, the walls of plastic insulation housing 30 are thinner than a conventional housing to accommodate the larger die pads 41A, 41B without significantly reducing resistance to moisture.

The lead frame also contains pins 1 to 4 and respective bond pad extensions which are within molded housing 30. These are originally integral with the lead frame body 40 (during molding), but are shown in their severed condition which isolates pins 1 to 4 from one another and from die pads 41A, 41B. Typically, pins 1 to 4 are coplanar with each other and with the die pads 41A, 41B.

Lead frame 40 is a conductive frame and may have a conventional lead frame solder finish. The bottom cathode surface of Schottky diode 22 and the bottom drain surface of MOSFET 21 are connected to die pad 41A via a conductive epoxy die attachment compound and are thus connected to pins 7 and 8. Alternatively, the cathode surface of Schottky diode 22 and the drain surface of MOSFET 21 may be soldered to die pad 41A or may be connected to die pad 41A using a conductive glass containing silver particles.

The anode electrode of Schottky diode 22 is wire bonded by gold bonding wires 50 and 51 to the source electrode of MOSFET 21. The source electrode and gate electrode of MOSFET 21 are bonded by gold wires 52 and 53 to the internal bonding extensions of pins 1 and 2, respectively. Alternatively, aluminum bonding wires may be used.

The drain of MOSFET 20 is connected to die pad 41B via a conductive epoxy die attachment compound and, therefore, is also connected to pins 5 and 6 of the lead frame 40. Alternatively, the drain surface of MOSFET 20 may be soldered to die pad 41B or may be conducted to die pad 41B using a conductive glass containing silver particles.

The source electrode of MOSFET 20 is wire bonded by gold bonding wires 54 to the internal bonding extension of pin 3. The gate electrode of MOSFET 20 is bonded by gold bonding wire 55 to the internal bonding extension of pin 4. Alternatively, aluminum bonding wires may be used.

The internal bonding extension of the pins are typically silver or gold plated. The bonding wires are generally bonded to the die surface and to the internal bonding extensions using thermosonic ball bonding, as is known in the art, though other processes may be used without departing from the scope of the invention.

Thereafter, the housing 30, which may be a mold compound such as NITTO MP7400, is formed in a conventional molding operation; however, other types of materials, such as ceramic, hermetic materials or an injection molded metal, may be used.

It should be noted that other package styles could be used, but the co-packaging in a surface-mount package (preferably an SO-8) conserves considerable board space. The resulting device can be soldered down to a printed circuit board using conventional mass production soldering techniques.

Although the present invention has been described in relation to particular embodiments thereof, many other variations and modifications and other uses will become apparent to those skilled in the art. It is preferred, therefore, that the present invention be limited not only by the specific disclosure herein, by only by the appended claims.

What is claimed is:

1. A semiconductor device, comprising:
   at least first, second, and third semiconductor dice, each having opposing surfaces which contain respective electrodes;
   a conductive lead frame including first and second separate die pad areas, the first and second semiconductor dice being disposed on the first die pad, and the third semiconductor die being disposed on the second die pad;
   a first plurality of pins being integral with and extending from one edge of the first die pad;
   a second plurality of pins being integral with and extending from one edge of the second die pad;
   a third plurality of pins being separated from one another and from the first and second die pads;
   a first plurality of bonding wires connecting one surface of the first semiconductor die to at least one of the third plurality of pins;
   a second plurality of bonding wires connecting one surface of the third semiconductor die to at least another one of the third plurality of pins; and
   a housing for encapsulating the lead frame, semiconductor dice, and bonding wires, the first, second and third pluralities of pins extending beyond a periphery of the housing for external connection.

2. The device of claim 1, wherein the housing and first, second, and third pluralities of pins conform to an SO-8 package standard.

3. The device of claim 1, wherein the first and second pluralities of pins are disposed along a common edge of the housing.

4. The device of claim 3, wherein the third plurality of pins is disposed along an opposite common edge of the housing.

5. The device of claim 1 wherein:
   the first and third dice are MOSFET dice, each having a source, drain and gate electrode;

the surfaces of the first and second MOSFET dice in contact with the respective first and second die pad areas are the drain electrodes; and the respective source and gate electrodes of the first and third MOSFET dice are connected to respective ones of the third plurality of pins.

6. The device of claim 5, wherein the third semiconductor die is a Schottky diode die, the opposite surface of the first semiconductor die comprising a cathode electrode of the Schottky diode being coupled to the first die pad area such that the cathode electrode of the Schottky diode is electrically connected to the drain electrode of the first MOSFET die and to the first plurality of pins, the opposite surface of the Schottky diode die comprising an anode electrode.

7. The device of claim 6 wherein the anode electrode of the Schottky diode die is coupled via bonding wires to the source electrode of the first MOSFET die.

8. The device of claim 7, wherein the housing and first, second, and third pluralities of pins conform to an SO-8 package standard.

9. The device of claim 7, wherein the first and second pluralities of pins are disposed along a common edge of the housing.

10. The device of claim 9, wherein the third plurality of pins is disposed along an opposite common edge of the housing.

11. The device of claim 1, wherein each of the third plurality of pins has an enlarged bonding pad area which is coplanar with the others and with respective die pad areas.

12. A semiconductor device, comprising:

first and second MOSFET dice, each having opposing surfaces which contain respective drain, source and gate electrodes;

a Schottky diode die having opposing surfaces which contain respective anode and cathode electrodes;

a conductive lead frame including first and second separate die pad areas, the first MOSFET die and the Schottky diode die being disposed on the first die pad such that the drain and cathode electrodes thereof are electrically coupled to the first die pad, and the second MOSFET die being disposed on the second die pad such that its drain electrode is electrically coupled thereto;

a first plurality of pins being integral with and extending from one edge of the first die pad;

a second plurality of pins being integral with and extending from one edge of the second die pad;

a third plurality of pins being separated from one another and from the first and second die pads;

a first plurality of bonding wires connecting the source electrode the first MOSFET die to at least one of the third plurality of pins;

a second plurality of bonding wires connecting the source electrode of the second MOSFET die to at least another one of the third plurality of pins; and a housing for encapsulating the lead frame, MOSFET and Schottky diode dice, and bonding wires, the first, second and third pluralities of pins extending beyond a periphery of the housing for external connection.

13. The device of claim 12 wherein the anode electrode of the Schottky diode die is coupled via bonding wires to the source electrode of the first MOSFET die.

14. The device of claim 12, wherein the housing and first, second, and third pluralities of pins conform to an SO-8 package standard.

15. The device of claim 12, wherein the first and second pluralities of pins are disposed along a common edge of the housing.

16. The device of claim 15, wherein the third plurality of pins is disposed along an opposite common edge of the housing.

17. The device of claim 12, wherein each of the third plurality of pins has an enlarged bonding pad area which is coplanar with the others and with respective die pad areas.

* * * * *